(12) United States Patent  (10) Patent No.: US 7,336,352 B2
Tanaka  (45) Date of Patent: Feb. 26, 2008

(54) POSITION DETECTION APPARATUS

(75) Inventor: Hiroshi Tanaka, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 457 days.

(21) Appl. No.: 10/807,306

(22) Filed: Mar. 24, 2004

(65) Prior Publication Data

US 2004/0189995 A1 Sep. 30, 2004

(30) Foreign Application Priority Data

Mar. 27, 2003 (JP) .............................. 2003-089135

(51) Int. Cl.
G01J 3/30 (2006.01)
(52) U.S. Cl. ...................... 356/306; 356/620; 356/401
(58) Field of Classification Search ................ 356/620, 356/401
See application file for complete search history.

(56) References Cited

U.S. PATENT DOCUMENTS

| 4,962,318 | A | * | 10/1990 | Nishi | 250/548 |
| 5,249,016 | A | * | 9/1993 | Tanaka | 355/53 |
| 5,827,629 | A | * | 10/1998 | Miyatake | 430/30 |
| 7,006,225 | B2 | * | 2/2006 | Tanaka | 356/401 |
| 2002/0036777 | A1 | | 3/2002 | Tanaka | 356/401 |
| 2002/0154283 | A1 | | 10/2002 | Tanaka et al. | 355/53 |
| 2003/0053058 | A1 | | 3/2003 | Tanaka | 356/401 |
| 2003/0053059 | A1 | | 3/2003 | Mishima et al. | 356/401 |
| 2003/0235330 | A1 | | 12/2003 | Tanaka | 382/151 |

FOREIGN PATENT DOCUMENTS

JP 2001-274058 10/2001

* cited by examiner

Primary Examiner—Tarifur Chowdhury
Assistant Examiner—Isiaka O Akanbi
(74) Attorney, Agent, or Firm—Fitzpatrick, Cella, Harper & Scinto

(57) ABSTRACT

An apparatus for detecting a position of a target mark out of a plurality of marks in a region of an object to obtain a position of the region of the object. The apparatus includes a scope configured to sense a first image of the object at a first magnification and a second image of the object at a second magnification higher than the first magnification, and a processor configured to extract, from the first image, a position of a first mark out of the plurality of marks and a feature of a region outside the first mark, to identify the first mark based on the extracted feature, to extract, from the second image, a position of the target mark, to evaluate reliability of the extracted position of the target mark, to select a second mark, different from the target mark, from the plurality of marks as a new target mark based on the evaluated reliability and the identified first mark in order to extract a position of the selected second mark from an image sensed by the scope at the second magnification.

14 Claims, 17 Drawing Sheets

POSITION DETECTION APPARATUS

FIELD OF THE INVENTION

The present invention relates to a technique for detecting a position of a target mark included in an object.

BACKGROUND OF THE INVENTION

Wafer alignment in a conventional semiconductor manufacturing apparatus will be described with reference to FIGS. 1, 4, 6A to 6C, and 7.

When a wafer W is supplied to the semiconductor manufacturing apparatus, a mechanical alignment apparatus MA performs mechanical alignment using the circumference of the wafer W and a mark called an orientation flat or a notch (N in FIG. 4) to determine the rough position of the wafer W. The precision of the mechanical alignment is about 20 µm. The wafer W is mounted on a chuck CH by a wafer supply apparatus (not shown) to perform global alignment. In global alignment, measurement marks FXY1 to FXY4 shown in FIG. 4 are measured, thereby obtaining shifts in the X and Y directions, a rotational component, and a magnification component of the shot array. The precision of the global alignment is less than 50 nm in a current machine for manufacturing a 265-Mbit memory.

To observe a mark in global alignment, the wafer W chucked by the wafer chuck CH on a stage STG is observed with a scope SC. The scope SC comprises a microscope having two types of magnifications and a sensor. Illumination light from an illumination light source Li passes through a half mirror M1 to come incident on an alignment mark on the wafer W. Light reflected by the alignment mark passes through the half mirror M1 and is split into two light components by a half mirror M2. One light component passes through a low magnification optical system to form an image on a sensor S1. The other light component passes through a high magnification optical system to form an image on a sensor S2. The wafer stage STG is moved by a motor MS in accordance with instructions from a controller MC, while a laser interferometer LP measures the accurate position of the stage.

Images formed on the sensors S1 and S2 are photoelectrically converted, and a mark position calculation processor P calculates the position of the mark. The calculation of the mark position is performed for each of the low- and high-magnification systems. An electrical signal is photoelectrically converted by the low magnification system sensor and is converted by an A/D converter AD1 from an analog signal to a digital signal, which is stored in an image memory MEM1. An image processing unit COM1 searches the memory by pattern matching, or the like, to obtain the mark position. As the low-magnification system sensor, an area sensor, such as a CCD camera, is used. An electrical signal from the high-magnification system sensor is converted by an A/D converter AD2 from an analog signal to a digital signal, which is stored in an image memory MEM2. An image processing unit COM2 calculates the mark position for the high-magnification system. The actual mark position is determined on the basis of the image on the high magnification system sensor S2. The position of the wafer W is determined from the mark position calculated in the image processing unit COM1 and the stage position specified by the controller MC.

The reason for the measurement by the two types of sensors will be described next. FIG. 6A shows a high-magnification system field HF. The visual field for the low-magnification system is a range MF shown in FIG. 6B. It is confirmed by the low-magnification system whether a result of mechanical alignment falls within the visual field of the sensor S2. If the result falls within the visual field, an alignment result obtained by the high-magnification system is adopted. If the result falls outside the visual field, small movement amounts dx and dy for aligning within the visual field of the sensor S2 are calculated. With this operation, global alignment can be completed with high precision at high speed, in spite of any error in mechanical alignment.

After the end of the alignment, the circuit pattern of a reticle MASK on a reticle stage RSTG is projected onto the resist on the wafer W via a projection lens LENS. In exposure, a masking blade MB is set in accordance with an exposure region on the reticle MASK by a reticle reference plate PL. Light emitted by an exposure illumination device IL exposes the wafer W via the masking blade MB, reticle MASK, and projection lens LENS.

The processing flow will specifically be described with reference to FIG. 7. In global alignment, the scope SC moves to a mark FXY1 (S101) to measure the positions of marks FX1 and FY1 (S102). Measurement is performed in accordance with the flow of step S10. This flow shows a case wherein the high-magnification system sensor S2 comprises an X-measurement high-magnification system and a Y-measurement high-magnification system. In this case, a line sensor, or the like, is used. X and Y marks may be image-sensed by an area sensor. X-direction image sensing at a high magnification (S110), Y-direction image sensing at high magnification, and image sensing at a low magnification are simultaneously performed. These types of image sensings need not be performed simultaneously, but simultaneous image sensing increases the speed. Mark position calculation of FX (S113) and FY (S114) and mark position calculation at low magnification are performed, and moving amounts dx and dy for an image to be made to fall within the visual field for high-magnification detection are calculated from a result of step S115 (S116). It is determined whether the amounts fall within an allowable range (S117). If the amounts fall within the range, results calculated in steps S113 and S114 are adopted. If the amounts fall outside the range, the wafer is image sensing at a high magnification (S119), Y-direction image sensing at a low magnification (S120), and mark position calculation of FX (S121) and FY (S122) are performed.

When the position of the mark FXY1 is calculated, the scope moves to the mark FXY2 (S103). The positions of marks FX2 and FY2 are calculated in the same manner (S104). When the two accurate mark positions are obtained, the rough position of the wafer W on the chuck CH is obtained. The target positions of marks FXY3 and FXY4 are calculated again by reflecting the result (S105). When the rough position is obtained, the mark position falls within the visual field for the high-magnification system. In steps S106 and S107, the mark positions of marks FX3, FY3, FX4, and FY4 are calculated, and global alignment ends.

If an error generated upon mechanical alignment is about 20 µm, as described above, the position of the wafer W can be calculated at high speed and high precision by global alignment by the low- and high-magnification systems. However, mechanical alignment is performed, not on the stage STG, but outside the stage. For this reason, if an error generated upon mounting the wafer W by a hand, or the like, on the chuck CH is 20 µm or less, the error may exceed 20 µm in absolute value if the wafer is manufactured by another apparatus. This amount is referred to as an offset. Even if the reproduction precision of mechanical alignment is high, variations in offset may occur due to a mechanical error in each mechanical alignment apparatus. Thus, if exposure as the preprocess is performed in another apparatus, and a wafer is observed by the low-magnification system, the wafer may be placed on the chuck while a mark is so shifted as to fall outside the visual field. In this case, an alignment mark formed in another process may fall within the visual field. If the alignment mark in the above process has the same shape, it is detected by mistake, and global alignment becomes impossible.

Semiconductor manufacturing methods are recently making progress, and, in particular, planarization, which performs a polishing process called CMP is contributing to an increase in the degree of intergration, and, for this reason, a layer on the alignment mark is also polished, and a mark signal may degrade or its stability may decrease. Alignment marks tend to be optimized in accordance with these processes. The structure of each mark such as the line width, spacing, and three-dimensional pattern has been changed to leave the optimum alignment mark. In general, marks are determined in the prototyping stage. In flexible manufacturing, however, semiconductors are often manufactured in quantity, without optimization.

Recent alignment tends to form a plurality of sets of alignment marks in one region (exposure region) from a set of X and Y alignment marks. This aims at performing deformation correction of the exposure region and increasing the precision by an averaging effect by measurement at a plurality of marks. In this case, the span of the exposure region should be increased as much as possible to increase the precision. More specifically, alignment marks tend to be formed at the four corners of the exposure region.

As described above, recent alignment mark formation has the following tendencies.

(1) The number of alignment marks increase with an increasing number of processes.

(2) The number of alignment marks increases for the optimization of the marks with increasing susceptibility of their structures.

(3) The number of marks increases for an increase in measurement precision.

For these reasons, the number of alignment marks in a scribe line in which alignment marks can be formed increases, and two or more alignment marks are often observed in the visual field for the alignment scope, as shown in FIG. 6C.

To solve the above-mentioned problems, the following method has conventionally been considered.

More specifically, alignment marks are separated from each other, such that two or more of them fall within the same visual field.

As describe above, since the number of alignment marks tends to increase, only optimized marks are formed in this method, if possible. In some cases, optimization needs to be performed for each lot, which is impractical. In a semiconductor manufacturing line, such troublesome operation is avoided. Even if this lot-by-lot optimization is possible, there is a limit on the number of alignment marks to be formed.

Under the circumstances, to solve this problem, Japanese Patent Application Laid-Open No. 2001-274058, discloses a method of identifying a target mark by, for example, forming identification marks around each alignment mark of deforming part of each alignment mark. However, in this method, if the target mark is greatly damaged after having undergone a wafer process step, such as CMP, the target mark cannot be identified.

In addition, measurement resolution may be insufficient when a detection apparatus having a wide visual field for giving a higher priority to the mark identification is to perform high-precision measurement. If the identification is possible, high-quality signals required for high-precision measurement are not always obtained.

SUMMARY OF THE INVENTION

In order to solve the above-mentioned problem, according to the present invention, an apparatus, which detects a position of a target mark included in an object, comprises a unity which senses an image of the object, a unit which extracts a first mark and feature of a region outside of the first mark in the image, and a unit which selects a second mark different from the target mark as a new target mark based on the position of the first mark and the feature.

According to the present invention, the position detection can accurately be preformed even when a target mark cannot be detected by, for example, when a target mark is damaged by a wafer process.

Other objects and advantages besides those discussed above shall be apparent to those skilled in the art from the description of preferred embodiments of the invention, which follows. In the description, reference is made to the accompanying drawings, which form a part thereof, and which illustrate an example of the invention. Such an example, however, is not exhaustive of the various embodiments of the invention, and, therefore, reference is made to the claims, which follow the description, for determining the scope of the invention.

DETAILED DESCRIPTION OF THE PREFERRED EMBODIMENTS

Embodiments of the present invention will be described below in detail with reference to the accompanying drawings.

First Embodiment

Figure 6A:
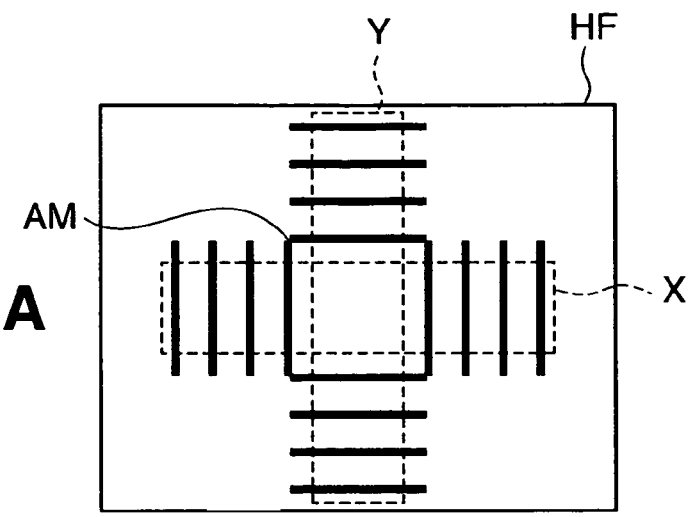
FIGS. 6A to 6C are views showing conventional alignment and alignment layouts.

A reference symbol AM in FIG. 6A shows an example of an alignment mark for use in global alignment. The alignment mark AM allows simultaneous measurement in the X and Y directions in global alignment.

In global alignment, a part of the mark in a window X shown in FIG. 6A is observed by the high-magnification detection system, thereby detecting the position of the mark with a resolution higher than that in prealignment.

Figure 4:
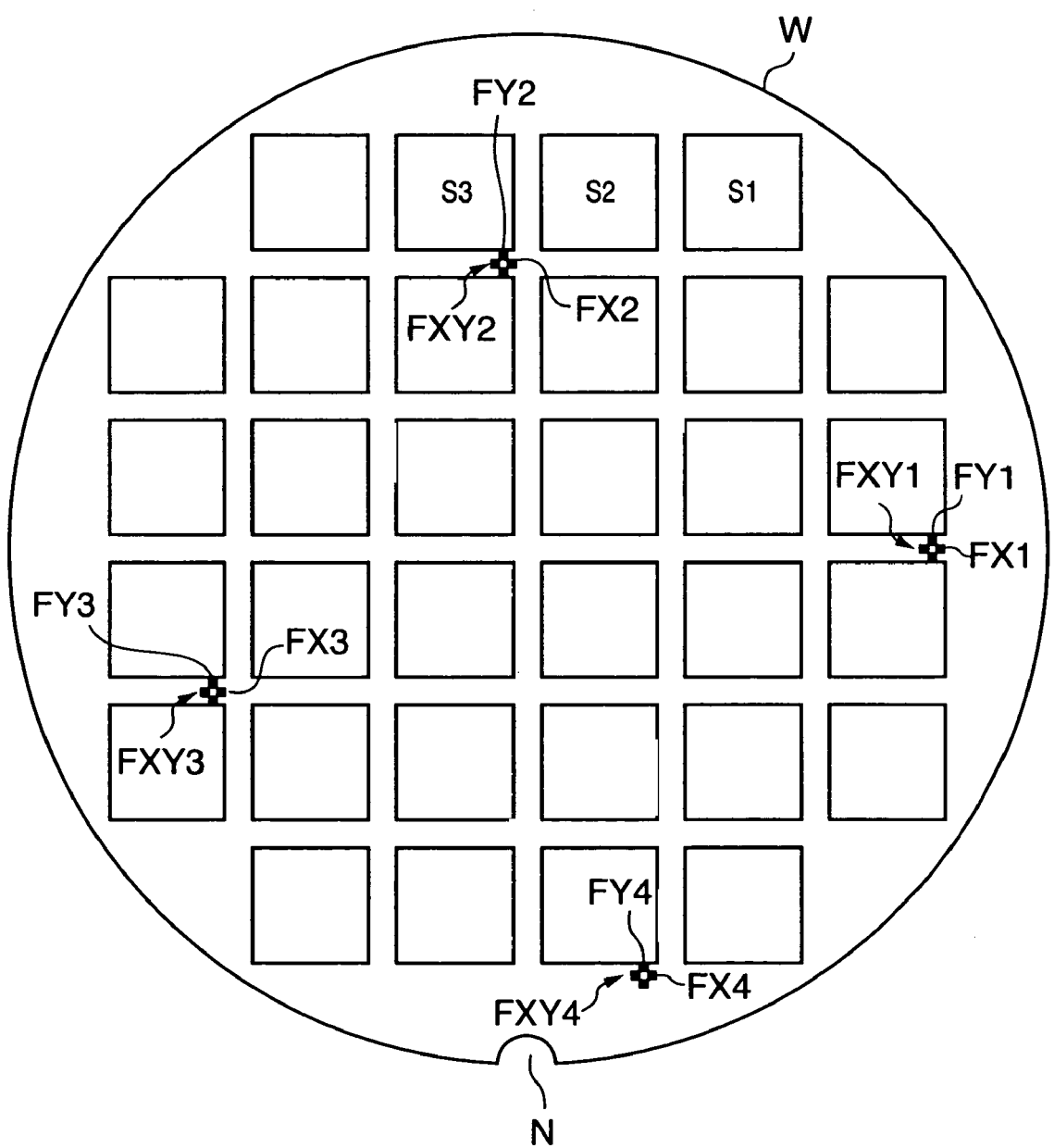
FIG. 4 is a view showing a state in which alignment marks are arranged on a wafer.

Global alignment operation will be described with reference to FIGS. 1 and 4.

When a wafer W is supplied to a semiconductor manufacturing apparatus, a mechanical alignment apparatus MA performs mechanical alignment using the circumference of the wafer W and a mark called an orientation flat or notch (N in FIG. 4) to determine the rough position of the wafer W. The wafer W is mounted on a chuck CH by a wafer supply apparatus (not shown). Global alignment is performed to obtain the accurate position of the wafer and that of an exposure shot. In global alignment, X-direction measurement marks FX1 to FX4 and Y-direction measurement marks FY1 to FY4 on the wafer are measured using a high-magnification scope (high-magnification detection system), thereby obtaining shifts in the X and Y directions, a rotational component, and a magnification component of the shot array.

A scope capable of simultaneously observing the mark AM shown in FIG. 6A by low- and high-magnification systems will be described in detail. A microscope (alignment scope) SC for wafer alignment shown in FIG. 1 can perform simultaneous observation by low- and high-magnification systems and mark position detection processing. Illumination light is guided from an illumination light source Li into the scope and passes through a half mirror M1 (or a polarization beam splitter) to come incident on a mark on the wafer W. For example, the mark FX1 of FIG. 4 is illuminated with the light. A light component reflected by the wafer W passes through the half mirror M1 and a half mirror M2 to reach a high-magnification detection sensor (photoelectric conversion element) S2. Similarly, a reflected light component from the wafer W passes through the half mirrors M1 and M2 and reaches a low-magnification detection sensor S1. Images or signals sensed by the sensors S1 and S2 are measured by a mark position calculation processor P as the position of the mark.

Figure 2A:
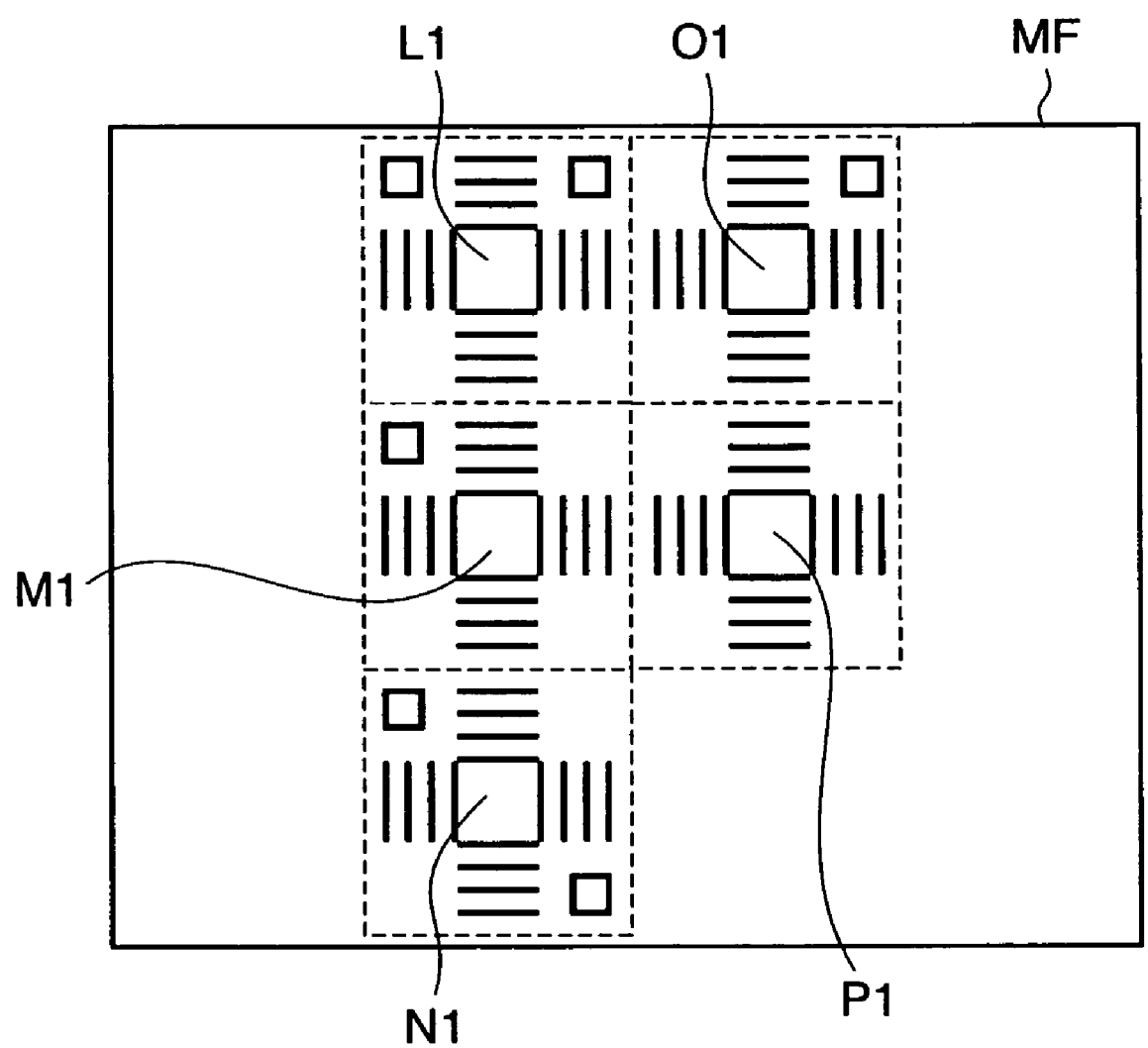
FIGS. 2A to 2E are views of alignment marks having identification marks according to the first embodiment.
Figure 2B:
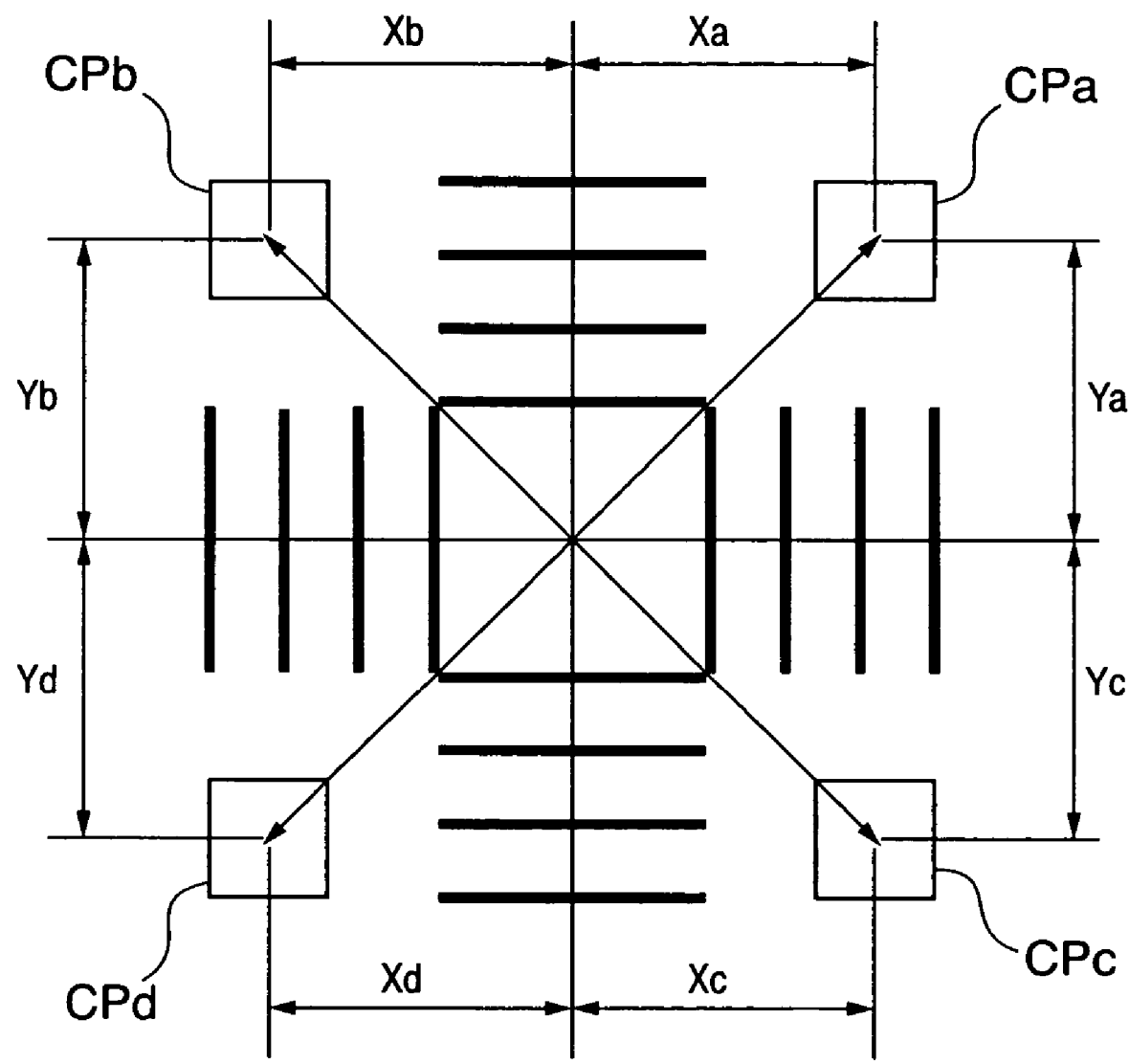
Figure 2C:
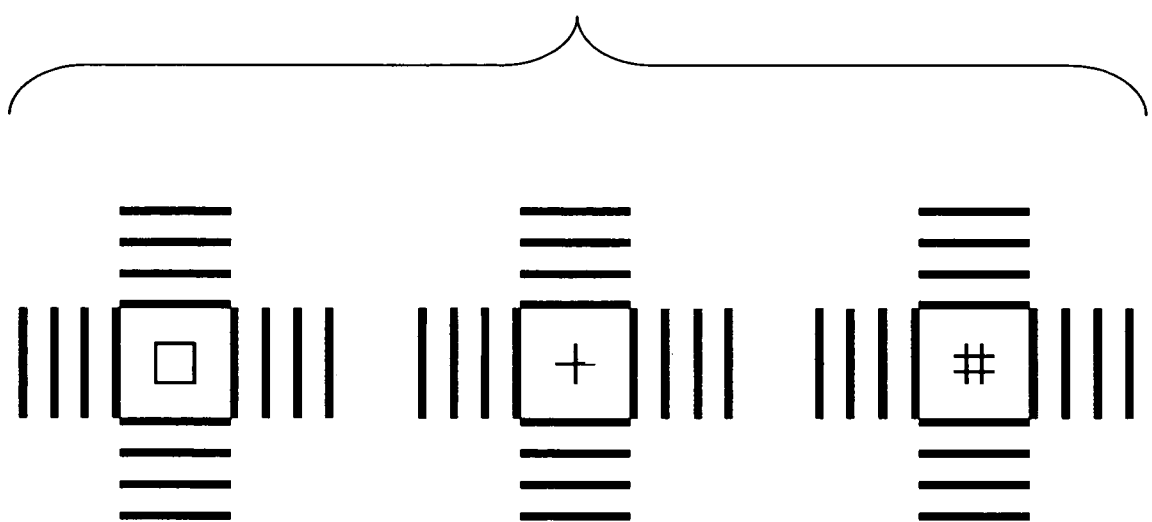
Figure 2D:
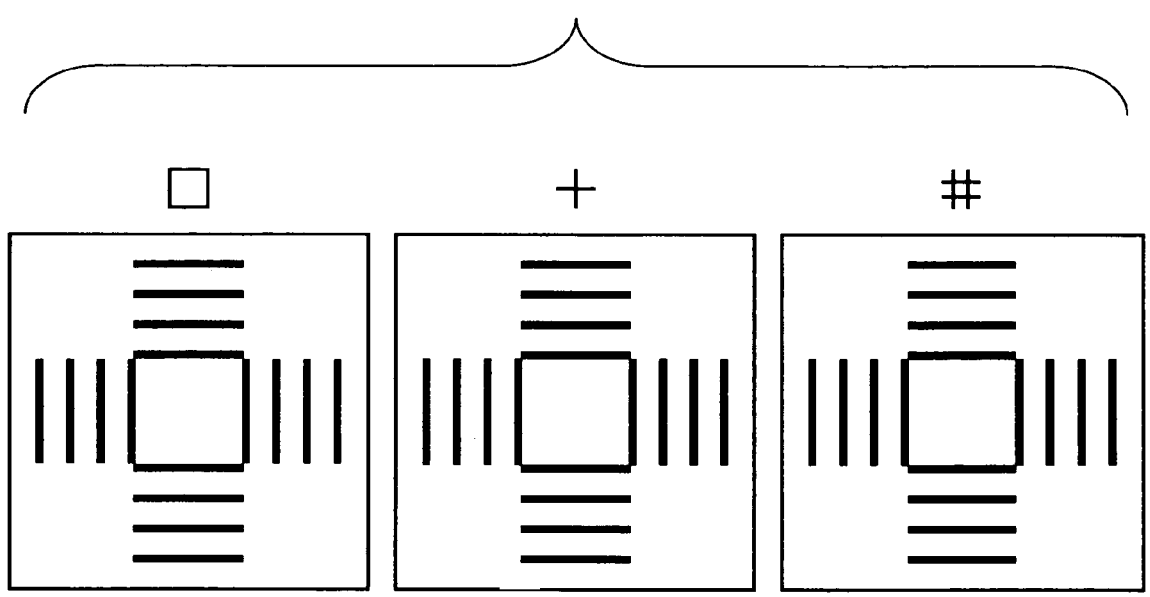

Calculation of the mark position is separately performed for each of the two types of sensors (low- and high-magnification systems). An electrical signal is photoelectrically converted by the low-magnification detection sensor S1. The resultant analog signal is converted by an A/D converter AD1 to a digital signal, which is stored in an image memory MEM1. An image processing unit COM1 searches the memory by pattern matching, or the like, to obtain the mark position. A template for the pattern matching is made up of eight vertical lines and eight horizontal lines, as shown in FIG. 2B. In template matching, matching processing is so optimized as to detect not only a mark having the same shape as that of the template, but also, a mark whose line width, or the like, deforms. Even if marks having the same shape coexist with marks having similar shapes, which have different line widths or mark stepped structures, the positions of all the marks are searched for.

Assume that there are a plurality of types of templates, and there are arranged two or more marks having the same shape as or a shape similar to that of a mark having eight vertical lines and eight horizontal lines, as shown in FIG. 2B, and two or more marks having the same shape as or a shape similar to that of a mark having six vertical lines and six horizontal lines. Even in this case, the positions of all the marks are searched for using the two types of templates. For example, if the number of templates is increased to an unlimited extent, there is no limit to the number of types of detectable marks.

As for a difference in reflected light between the high-magnification system and the low-magnification system, the accumulation times of the sensors S1 and S2 are made different to prevent any switching on the illuminant side. This embodiment will not explain the template matching for, particularly, the accumulation time. Note that the detection method is not limited to pattern matching or template matching.

Figure 6B:
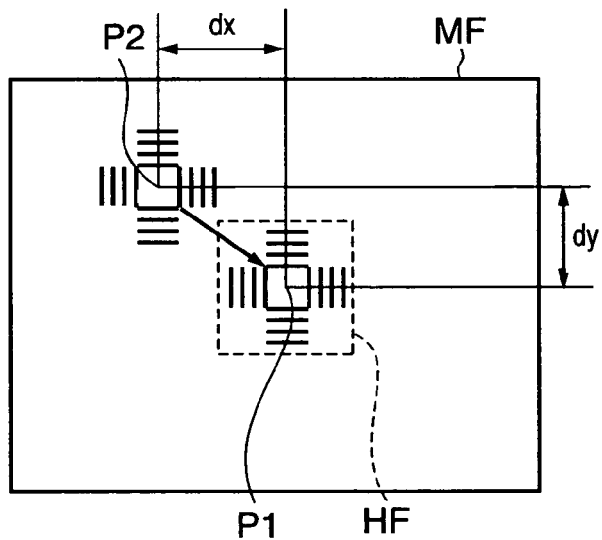
Figure 6C:
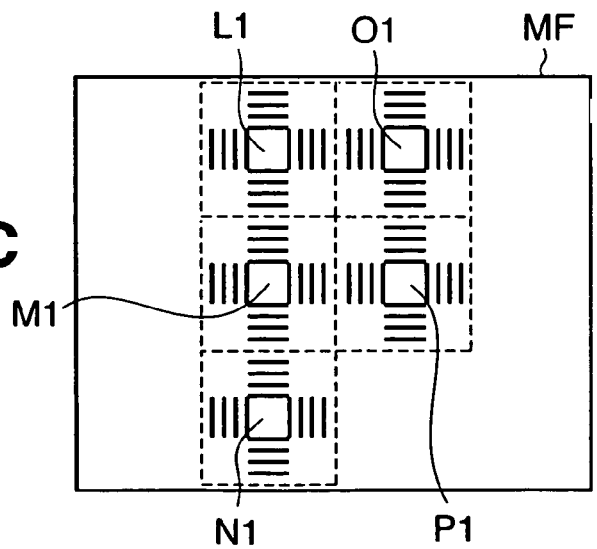

The relationship between the magnifications and visual fields of the high- and low-magnification systems and alignment marks will be described with reference to FIGS. 6A to 6C.

FIG. 6A shows an observable visual field HF for the high-magnification system. The observable visual field HF leaves little margin for movement of marks X and Y. FIG. 6B shows an observable visual field MF for the low-magnification system. The visual field MF is wider than the visual field HF and is used to calculate small movement amounts (shift amounts) dx and dy for driving an alignment mark into the high-magnification visual field HF in simultaneous observation by the high- and low-magnification systems.

High-speed wafer alignment using marks in FIGS. 2A to 2E and the alignment scope SC shown in FIG. 1 will be described.

Light is split into two light components by the half mirror M2. One light component passes through the half mirror M2 and is guided to the photoelectric conversion element S2 in a high-magnification detection imaging optical system to form an image of the alignment mark AM on the element S2. The other light component is guided to the sensor (photoelectric conversion element) S1 in a low-magnification imaging optical system to form an image of the alignment mark AM on the element S1. At this time, the images of the alignment mark AM are simultaneously formed on the sensors (photoelectric conversion elements) S1 and S2. If the shift amounts dx and dy shown in FIG. 6B fall within an allowable range, simultaneous imaging results in the formation of an image, of the alignment mark AM, whose position can accurately be measured, on the sensor (photoelectric conversion element) S2 of the high-magnification detection system. The position of the alignment mark is calculated using a signal which is obtained by the high-magnification system sensor S2 from the captured image of the alignment mark, and the calculation result is effective. If the shift amounts fall within the allowable range, the mark is determined to be located within the windows X and Y shown in FIG. 6A. Therefore, if the shift amounts dx and dy, which are obtained by measurement using the low-magnification system, fall within the allowable range, the detection position can be determined by the high-magnification system at the highest speed. If the shift amounts fall outside the range, measurement by the high-magnification system is performed after finely moving a stage by dx and dy.

Mark discrimination with alignment marks having similar shapes in a visual field will be described with reference to FIG. 2A. In the following description, P1 is assumed to be the target mark to be transferred in a photolithographic process. A previous photolithographic process may have executed alignment, and alignment marks, L1, M1, N1, and O1 having the same shape in the previous process may remain adjacent to the mark P1.

The marks L1, M1, N1, O1, and P1 may have similar shapes and different mark line widths and three-dimensional patterns for optimization of the alignment mark structure. As described above, each mark has a free shape, and the present invention is not limited to this. The positions of the marks L1, M1, N1, O1, and P1 are stored in advance in an exposure control program (JOB) in the photolithographic process. This positional information may be input for each JOB or the coordinates of a previously formed or used alignment mark may be extracted from a project file, which is a collection of JOBs for manufacturing IC products, that is, previous JOBs. To find the mark P1 in the visual field to obtain the above-mentioned shift amount dx and dy, as shown in FIG. 2B, auxiliary patterns CPa, CPb, CPc, and CPd for mark identification are added within a range free from any influence on high-magnification measurement of the alignment mark shown in FIG. 6A. For example, no auxiliary pattern is added to the mark P1, while a small square is added to the mark O1 at the upper right position. Auxiliary patterns are added to the marks L1, M1, N1, O1, and P1, respectively, at different positions in regions free from any influence on high-magnification measurement.

A method of discriminating a plurality of marks to which auxiliary patterns are added will be explained with reference to FIG. 2B. If a search is executed in a state of FIG. 2A, five mark positions are detected. The presence or absence of each of the auxiliary patterns CPa, CPb, CPc, and CPd in the corresponding region is determined for each of the five detection positions by template matching or on the basis of a change in contrast, histogram, or the like. The distances to the auxiliary patterns may be or may not be the same. In FIG. 2B, coordinates (Xa, Ya) represent the distance from the center of P1 to that of CPb; coordinates (Xb, Yb), the distance from the center of P1 to that of CPb; coordinates (Xc, Yc), the distance from the center of P1 to that of CPc; and coordinates (Xd, Yd), the distance from the center of P1 to that of CPd. The shapes of the auxiliary patterns CPa, CPb, CPc, and CPd need not be square. Each auxiliary pattern needs not be located near the high-magnification mark measurement range as far as the auxiliary pattern is located within the visual field of the sensor S1, and can be observed.

With the following information, each alignment mark can be identified.

|    | CPa     | CPb     | CPc     | CPd    |
|----|---------|---------|---------|--------|
| L1 | present | present | absent  | absent |
| M1 | absent  | present | absent  | absent |
| N1 | absent  | present | present | absent |
| O1 | present | absent  | absent  | absent |
| P1 | absent  | absent  | absent  | absent |

To identify the mark P1, the presence or absence of a mark having a combination of auxiliary patterns corresponding to P1 out of the five alignment marks in the above table must be determined. If discrimination is performed for four sections, sixteen kinds of discrimination results can be obtained.

This embodiment will be described more specifically with reference to the flow chart shown in FIG. 5.

Figure 7:
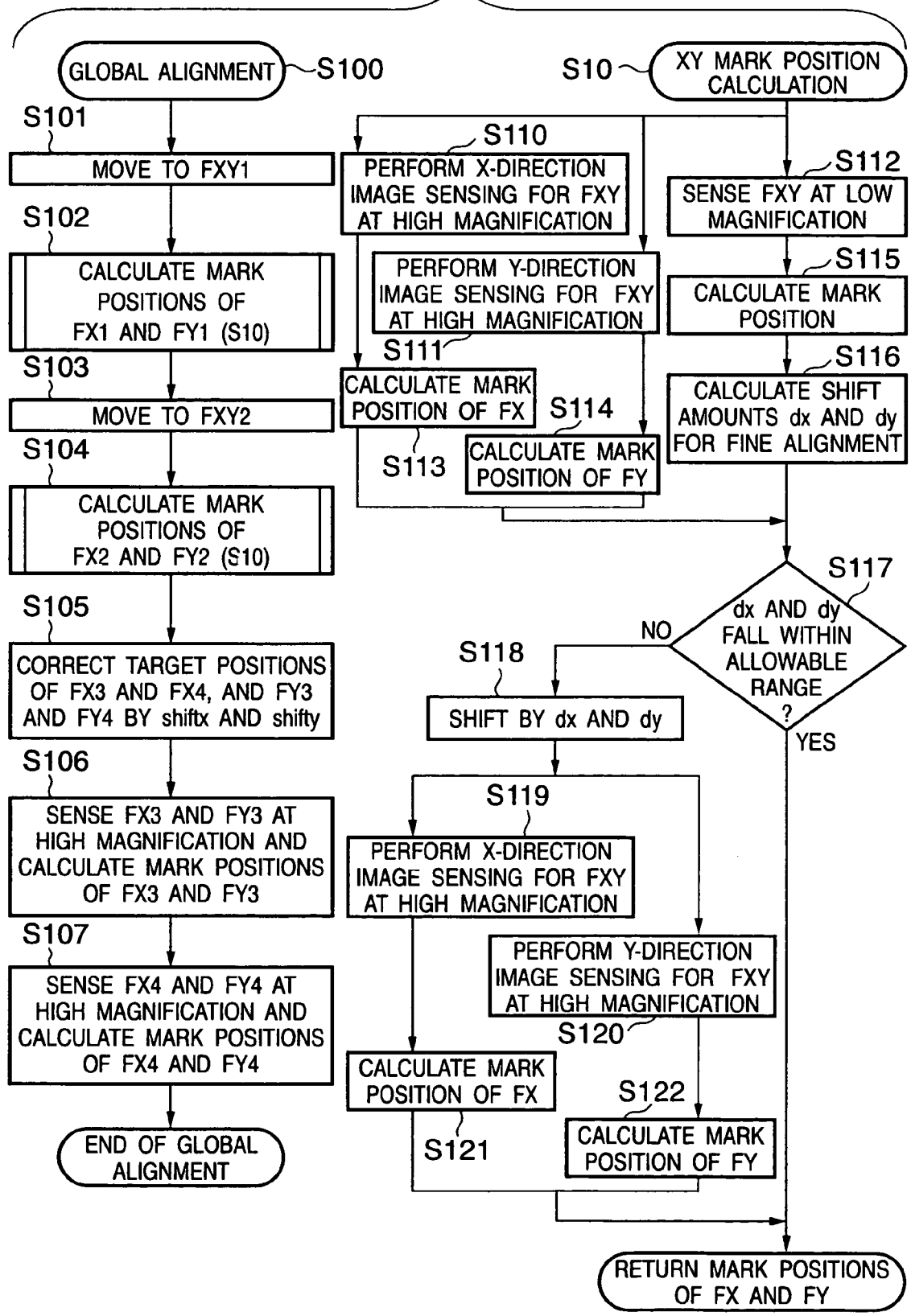
FIG. 7 is a flow chart showing a conventional alignment sequence.

The schematic flow in wafer exposure is different from the flow described in steps S100 to S107, shown in FIG. 7. The flow of calculating the mark position of this embodiment starts at step S100. The scope moves to a first measurement mark FXY1 (S101). A plurality of similar marks as shown in FIG. 2A are formed around the mark FXY1, and the target alignment mark FXY1 is among them. Note that two marks FXY1 and FXY2 are used in simultaneous detection by the low-magnification and high-magnification systems. The first mark FXY1 to be detected by the low-magnification and high-magnification systems is subjected to low-magnification image sensing, and high-magnification X-direction image sensing, and high-magnification Y-direction image sensing at the same time (S210, S211, and S212). Mark position calculation is performed for each captured image. Although the high-magnification system may not image-sense the mark properly, mark position calculation is performed for the obtained images (S113, S114, and S115). The low-magnification system image-senses the mark in the range of the reproducibility of the mechanical alignment, that is, in a range so wide as to include the mark within the visual field, and thus, can obtain the mark position. At this time, a plurality of similar marks are observed in a state as shown in FIG. 2B. In step S215, mark position calculation is performed. In mark position calculation, the positions of the plurality of marks, including the target in the visual field, are calculated. Out of the plurality of marks, the target alignment mark is identified using identification mark information (S219).

In some cases, the target mark cannot be identified due to a signal degradation, or the like. If the target mark cannot be identified (S220), the accurate position of the target mark is estimated using the positional relationship between the position of the target and the positions of the remaining marks stored in advance in the JOB to select the target mark (S221).

The high-magnification system simultaneously performs the mark position calculation for the target, and the reliability of the mark measurement is evaluated from the calculation result. If it is determined that the reliability is low, and the accurate mark position cannot be calculated (S216), the target is changed to another mark on the basis of the positions of the plurality of marks, including the current target mark, which are obtained in steps S215 and S219 (S217).

Various standards are available to determine that the mark position cannot be calculated by the high-magnification. More specifically, there are a standard that the contrast and S/N of signals are below predetermined threshold values, and a standard that the interval calculated from the center position of each of the plurality of signals has a large deviation from the mark design value. The method of measuring the reliability in mark measurement is not limited to the methods described above.

If a mark for the low-magnification system is identified, if the target mark is selected, or if it is determined that high-magnification measurement is not possible, and the target is changed, mark shift amounts dx and dy are determined to measure the selected target mark by the high-magnification measurement, that is, they fall within the allowable range, and the accurate position can be calculated from images of the alignment mark captured by the high-magnification system. The mark positions of Fx and FY calculated in steps S213 and S214 are adopted, and mark position detection ends (S223). If the shift amounts fall outside the allowable range, the high-magnification system has not image-sensed the alignment mark properly. Accordingly, the stage is shifted by dx and dy (S224), and high-magnification image-sensing is performed again (S225 and S226).

Then, mark position detection (S227 and S228) is performed to determine the mark positions of FX1 and FY1. If it is determined that the mark positions are not calculated properly (S229), the target is changed on the basis of a result obtained in steps S215 and S219 (S230). When the target is changed, the stage is shifted by dx and dy on the basis of the position of a new target (S224), and high-magnification measurement is performed again.

If the shift amounts dx and dy fall within the allowable range, or the accurate mark position can be calculated, the scope moves to a second alignment mark FX2 (S103), as shown in FIG. 7. Since the second mark requires simultaneous measurement by the low-magnification and high-magnification systems, the mark position of FX2 and FY2 are calculated in accordance with the flow in S110 of FIG. 5. At this time, the X and Y positions of the wafer W on a stage STG have been obtained in advance using the first alignment mark FXY1. When the scope is to move to the second mark position, the search range which allows for an error of an undetermined component θ may be limited to an area SA near the center within the visual field, as shown in FIG. 3B.

To calculate the third and fourth mark positions, the target position shifts (shifts X and shifts Y), rotational components θ, and wafer magnification components Mag of the third and fourth marks are obtained from the positions (FX1, FY1)

and (FX2, FY2) of the marks FXY1 and FXY2 (S105). The shift X, shift Y, and rotational component θ represent a shift amount generated when the wafer W is mounted on the chuck CH, which is an offset in mechanical alignment. The wafer magnification Mag represents an extension of a shot pattern on the wafer. If the shift amount and extension are large, the mark cannot be moved to a position immediately below the alignment scope even by moving the wafer directly to the positions of the third and fourth marks. For this reason, the shot layout of the wafer and the shift of the stage coordinate system are calculated on the basis of the amounts of θ, Mag, shift X, and shift Y. That is, the fine correction amount, by which the grating of the wafer is corrected to be aligned with that of the stage, is obtained. When the third and fourth marks are shifted to the alignment scope position, the fine correction amount is reflected. This makes it possible to directly observe the third and fourth marks by the high-magnification system without processing by the low-magnification system.

At this time, θ may be corrected by rotating the chuck CH, on which the wafer is mounted, or the stage STG. Since rotation may prolong the wafer processing time, in this embodiment, rotation is not desirably preformed. After measurement of the first to fourth marks, wafer alignment ends.

Figure 1:
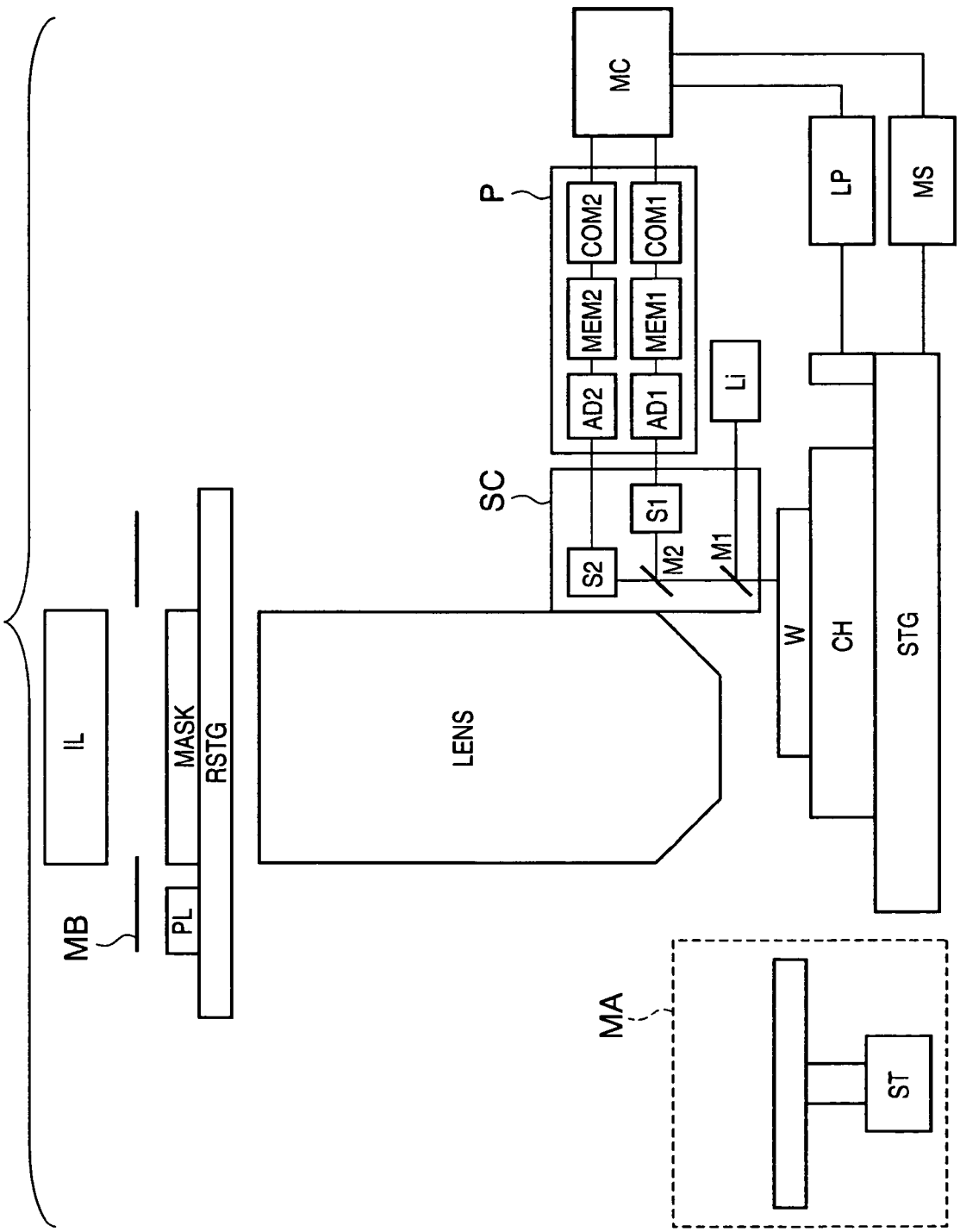
FIG. 1 is a schematic view of a semiconductor manufacturing apparatus according to an embodiment of the present invention.

FIG. 1 illustrates an off-axis alignment semiconductor manufacturing apparatus. Any type, such as the TTL alignment type or the TTR alignment type, in which a wafer mark is observed through a reticle (mask), may be used as far as a scope capable of observing a mark simultaneously at low and high magnifications, is used. The number of alignment marks is not limited to four, which is the number of this embodiment.

Figure 5:
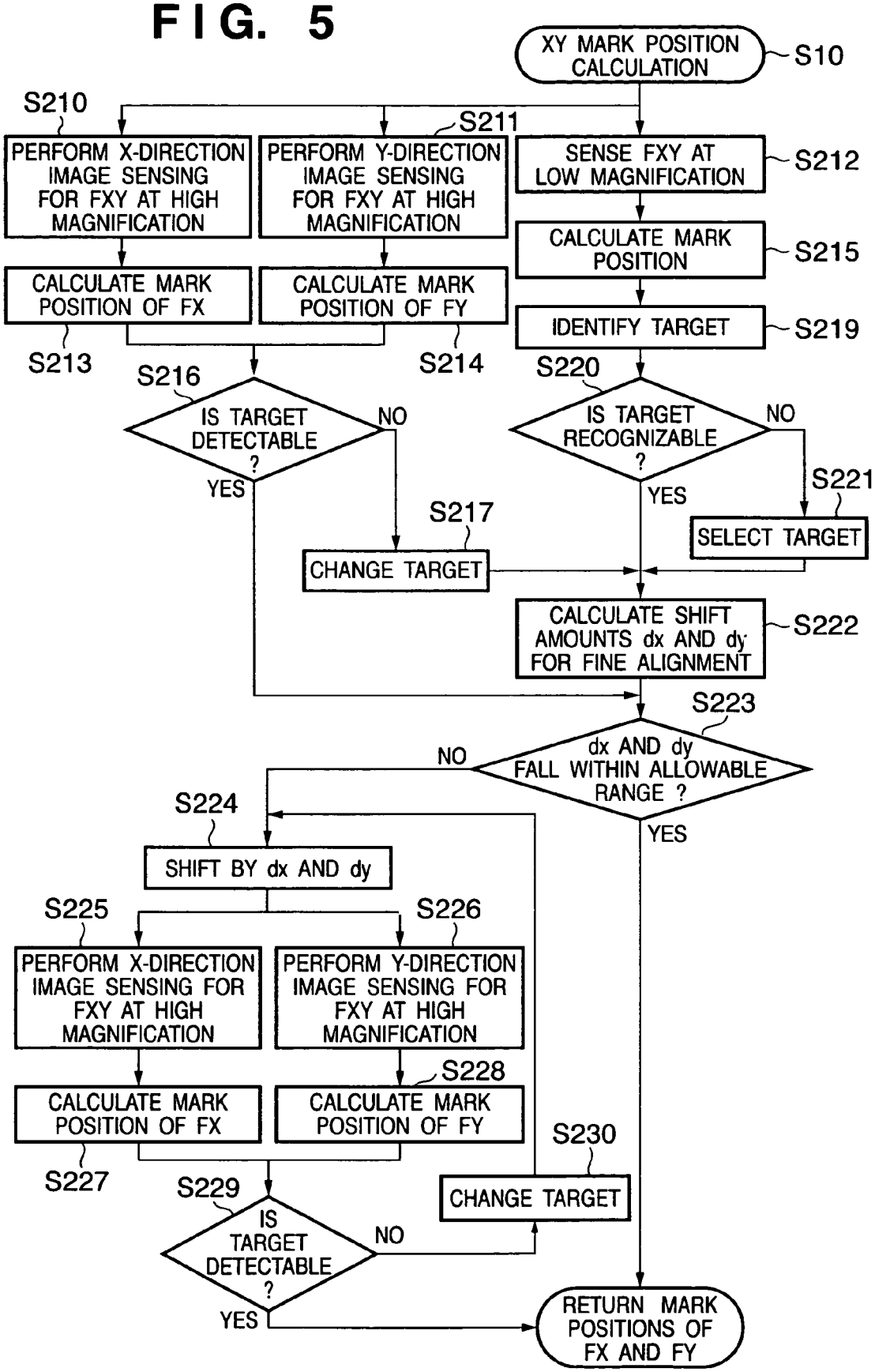
FIG. 5 is a flow chart showing an alignment sequence according to the embodiments of the present invention.

Alignment may not necessarily be performed in accordance with the flow shown in FIG. 5. Any other sequential processing may be performed. More specifically, each mark may be image-sensed by the low-magnification system (S212 and S215), and target identification (S219) and selection (S221) may be performed to calculate the shift amounts dx and dy (S222). Then, the stage may be moved by dx and dy (S224), and high-magnification detection (S225 and S226) and mark position calculation (S227 and S228) may be performed. Although sequential execution decreases the processing speed, even a hardware arrangement incapable of simultaneous measurement can perform mark identification in which a plurality of similar marks appear in the visual field.

Figure 2E:
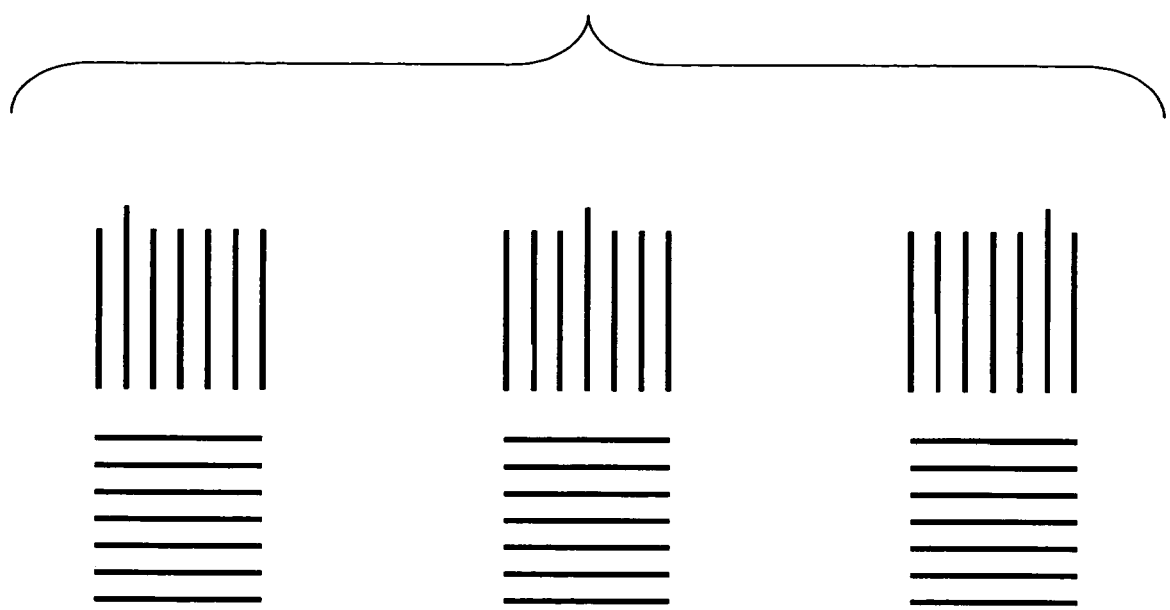

FIG. 2B shows an auxiliary pattern for mark identification. The shape and layout, however, are not limited to this. A modification of FIG. 2C, in which identification marks differ in shape, or a modification of FIG. 2D, in which identification marks are separated from corresponding alignment marks, can produce the same effect. In these cases, a plurality of mark positions are calculated in the visual field of the low-magnification system, and the shape of a mark pattern at a predetermined position is determined from each mark position by image processing, such as template matching using templates for patterns. As shown in FIG. 2E, marks may partially be deformed to an extent which does not affect measurement, and may be identified. This identification may include various processes, such as measurement of the mark length.

Exposure processing is not generally performed for one wafer, and several wafers are processed as a lot. To align the second and subsequent wafers, an alignment result of the first wafer can be used. Since the state of degradation of a target mark is highly likely to be stable within a lot, a target mark set for the first wafer is used as the target mark for the second and subsequent wafers. As a result, the probability of good mark position measurement without mark selection and mark change increases. Secondly, an offset of mechanical alignment is obtained, and a search area SA can be narrowed to the center of the visual field, as shown in FIG. 3B for the second and subsequent wafers. This leads to mismeasurement and an increase in speed of image processing.

Assume that the target mark is changed to an alignment mark used in a previous process. An alignment result of the previous process is already measured in an inspection process. The inspection result in the previous process is stored as an alignment mark offset. If the stored alignment mark offset is reflected in changing the target mark, the wafer is accurately exposed to the pattern on the reticle.

Second Embodiment

The second embodiment will be described wherein a target mark is determined out of a plurality of similar marks in the same visual field. Note that the basic hardware arrangement, alignment marks, and measurement flow are the same as those in the first embodiment, and a detailed description thereof will be omitted. Only the differences will be described.

Figure 3A:
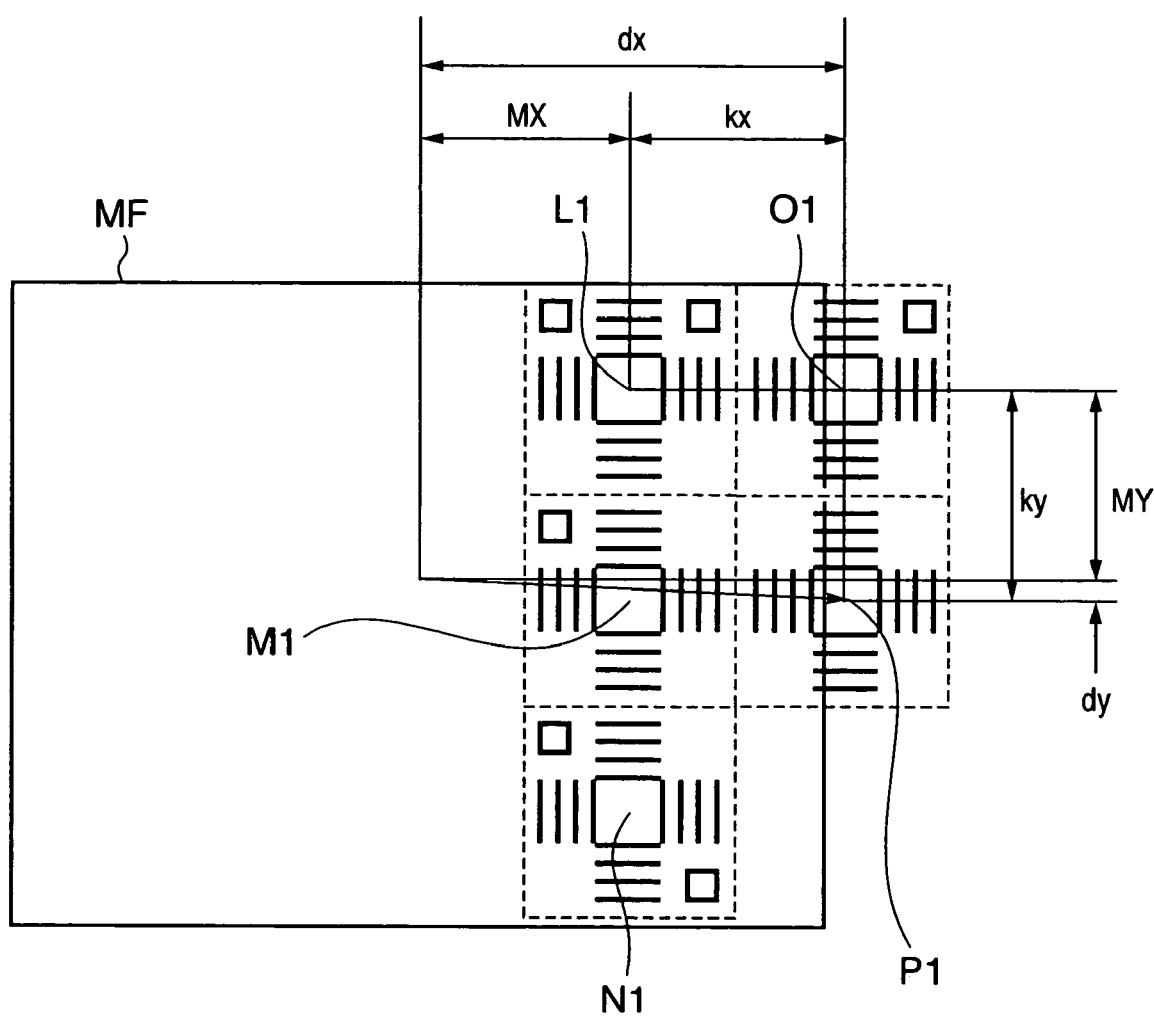
FIGS. 3A to 3E are views for explaining a position detection method according to the second embodiment.
Figure 3B:
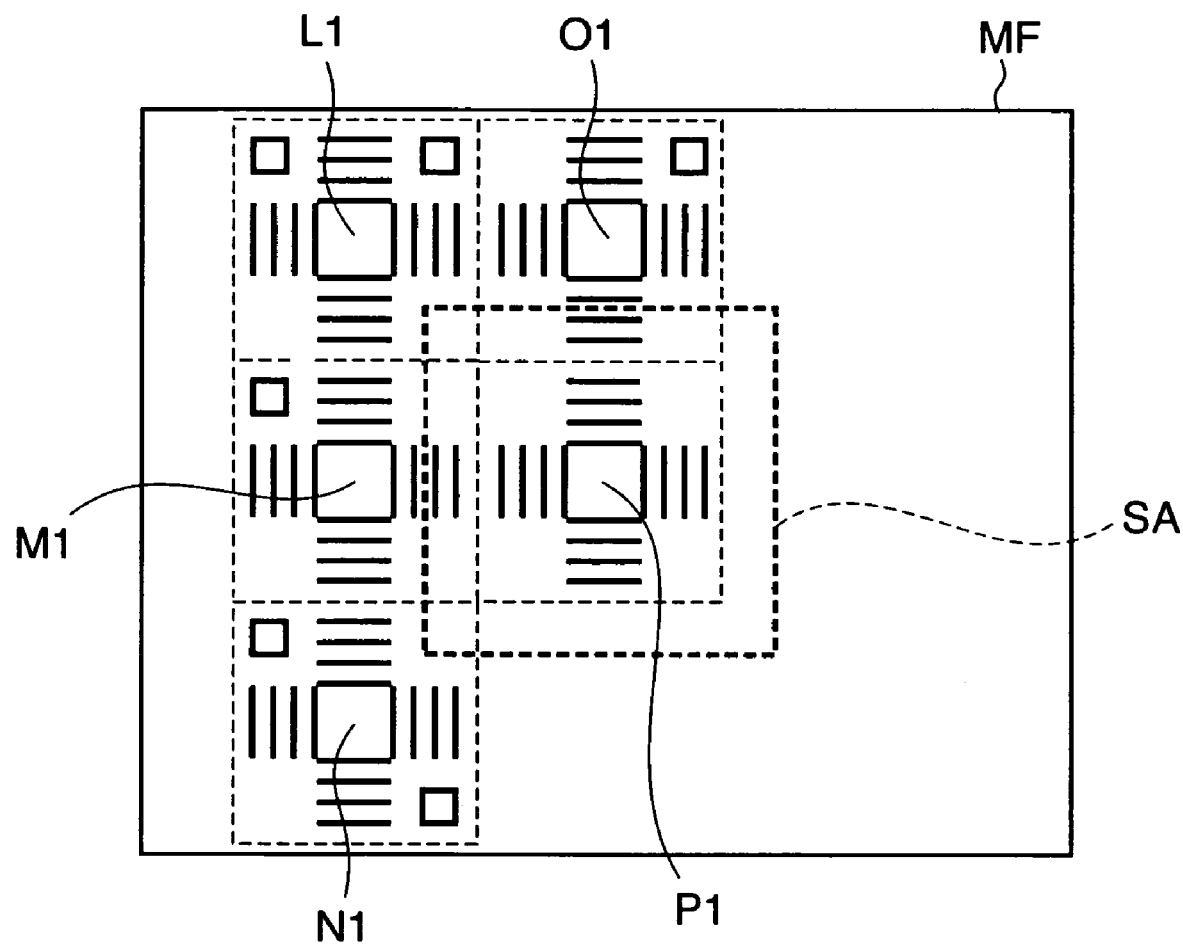

If a target mark P1 falls outside a visual field, as shown in FIG. 3A, mark detection is generally impossible. Similar marks other than the mark P1 fall within the visual field. If the positional relationship between P1 and each of marks L1, M1, N1, and O1 is stored in advance, any of the marks L1, M1, N1, and O1 is changed to a new target mark. At this time, shift amounts dx and dy for fine measurement are calculated on the basis of the position of the target mark selected out of the detectable marks. For example, assume that the mark L1 can be detected. The mark L1 is changed to the new alignment mark, and amounts dx and dy by which a stage is moved for fine measurement are calculated. The position of the mark L1 is detected with a high-magnification scope. If it is determined that the mark position cannot be measured using signals obtained by the high-magnification scope by a method of evaluating the reliability of mark measurement of the first embodiment, one of the remaining marks other than L1 is changed to the target mark. The stage is moved, and mark measurement is repeated. As described above, even if a predetermined target mark cannot be specified, high-magnification detection can be performed by changing the target mark to a peripheral mark, which has been observed.

Even if the mark P1 is not present within the visual field, the position of the mark P1 is estimated from the positional relationship between P1 and each of the peripheral marks L1, M1, N1, and O1. The stage is moved to the position of the target mark P1 to perform high-magnification measurement. At this time, if it is determined that high-magnification measurement is impossible, any of the marks L1, M1, N1, and O1, whose positional relationships are stored, may be changed to a new target mark.

Third Embodiment

The third embodiment will be described wherein a target mark is determined out of a plurality of similar marks in the same visual filed. The first and second embodiments explain a method of adding auxiliary patterns and discriminating marks using the auxiliary patterns. The third embodiment will describe a method of determining, without any auxiliary patterns, a target mark out of a plurality of patterns having similar shapes in a visual field. Note that the basic hardware arrangement, alignment marks, and measurement flow are the same as those in the first embodiment, and a detailed description thereof will be omitted. Only the differences will be described.

Figure 3C:
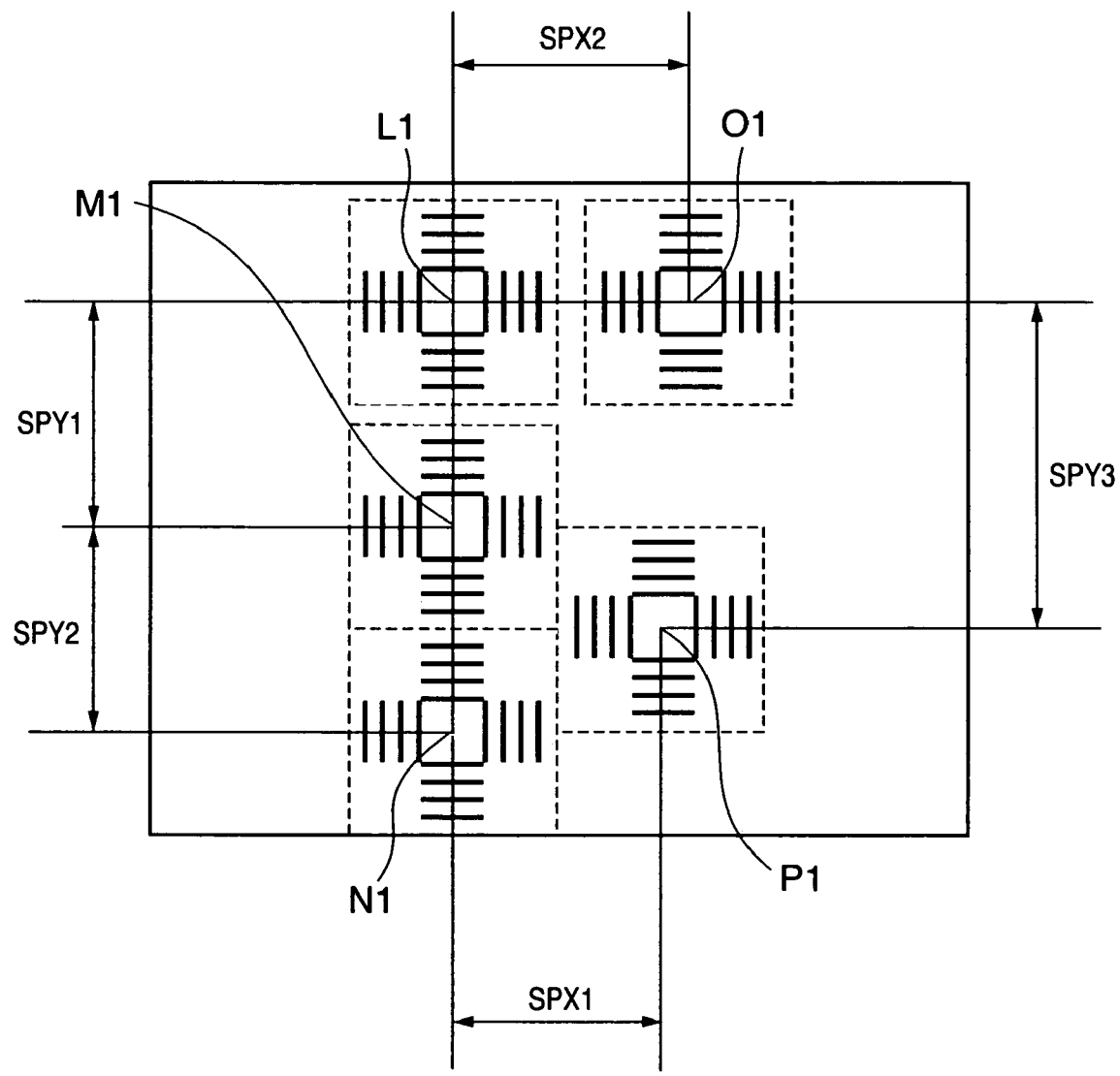

As shown in FIG. 3C, a target mark P1 falls outside the visual field, and similar marks other than the mark P1 fall within the visual field. The target mark P1 is separated from the marks by different spacings. Spacings SPX1, SPX2, SPY1, and SPY2 are different from each other. All the marks are arranged such that the visual field has only one combination of relative spacings. If the mark centers of all the marks can be located in the visual field, the second mark from the top on the right side is always P1, because there is no variation in combination of the relative spacings. The mark positions of the remaining marks are also determined.

It is, of course, possible to identify the target mark from these marks. If it is determined by a method of evaluating the reliability of mark measurement of the first embodiment that the target mark cannot be detected by the high-magnification system due to, for example, a signal degradation, any of located marks is changed to the target mark.

Assume that the target mark falls outside the visual field, the marks on the left side fall within the visual field, and marks L1, M1, and N1, can be identified, as described in the second embodiment. In this case, any of marks L1, M1, and N1, is immediately selected as the target mark, amounts dx and dy by which the stage is moved for fine measurement are calculated on the basis of the stored coordinates, and position detection is performed by the high-magnification system. The positions of P1 and O1 can be estimated from the positional relationships with L1, M1, and N1 and can be selected. If it is determined that high-magnification measurement is impossible, any of the remaining marks whose positional relationship is stored is changed to the target mark. Then, the stage is moved to repeat mark measurement. As described above, even if the predetermined target mark cannot be specified, high-magnification detection can be performed by changing the target mark to any of the observed peripheral marks.

Fourth Embodiment

The fourth embodiment will be described wherein a target mark is determined out of a plurality of similar marks in the same visual field. The first and second embodiments describe a method of adding auxiliary patterns and identifying marks using the auxiliary patterns, and discriminating the target mark from the peripheral mark positions when the target mark cannot be discriminated, and a method of changing any of the peripheral marks whose positions are obtained to the target mark when high-magnification measurement is impossible. The third embodiment describes a method of differing relative spacings between a plurality of similar marks without any auxiliary patterns, specifying the position of the target mark, and discriminating the target from the peripheral mark positions when the target mark cannot be discriminated, and a method of changing any of the peripheral marks whose positions are obtained to the target mark when high-magnification measurement is impossible.

The fourth embodiment will describe a method of identifying and changing the target mark when there are no auxiliary patterns, a plurality of similar marks are arranged at the same relative spacings, and there are a plurality of patterns having similar shapes in a visual field. Note that the basic hardware arrangement, alignment marks, and measurement flow are the same as those in the first embodiment, and a detailed description thereof will be omitted. Only the differences will be described.

Figure 3D:
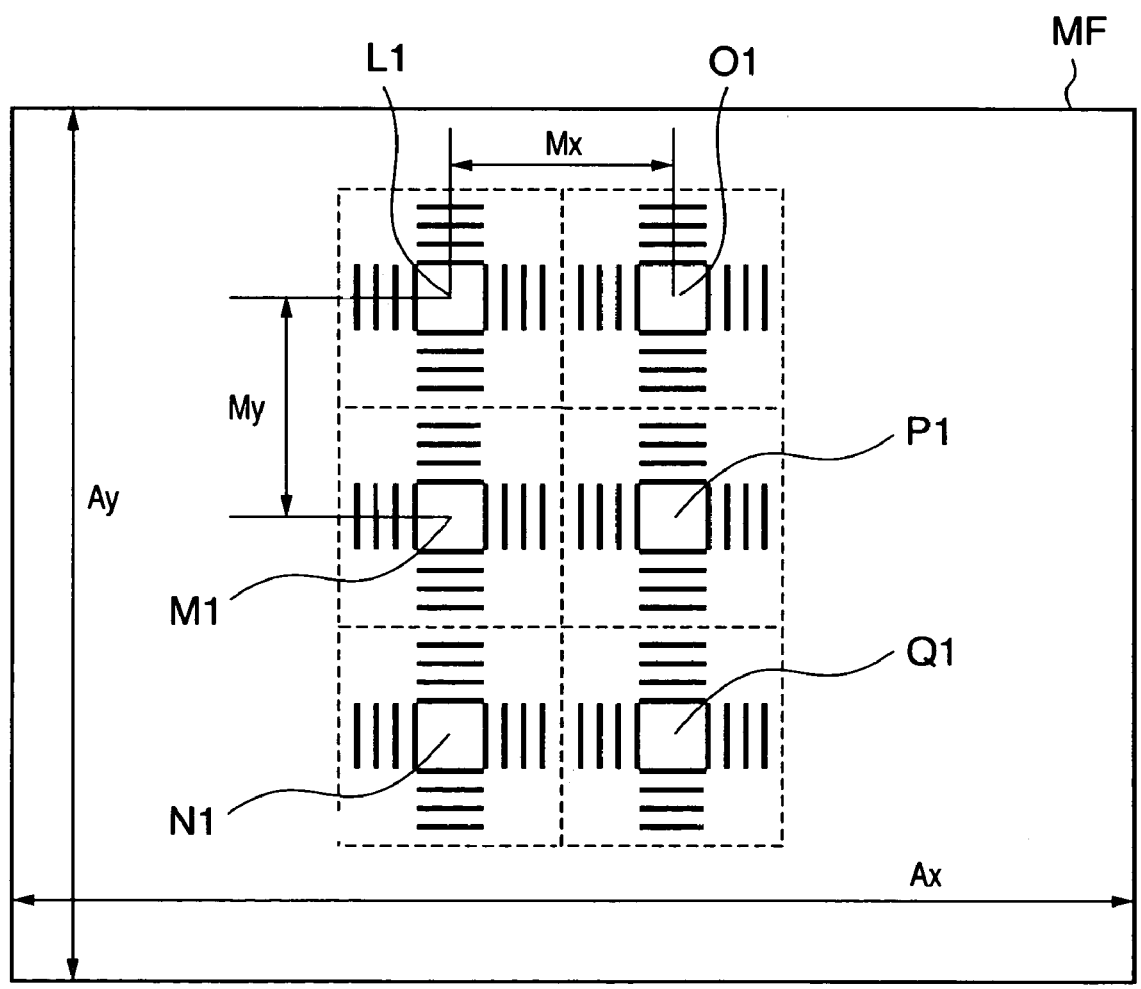

As shown in FIG. 3D, a target mark P1 and other similar patterns fall with in the visual field. Note that formed marks are all arranged within the visual field.

If all the marks are searched for within the visual field, the target mark P1 is located at the second position from the top on the right side.

Figure 3E:
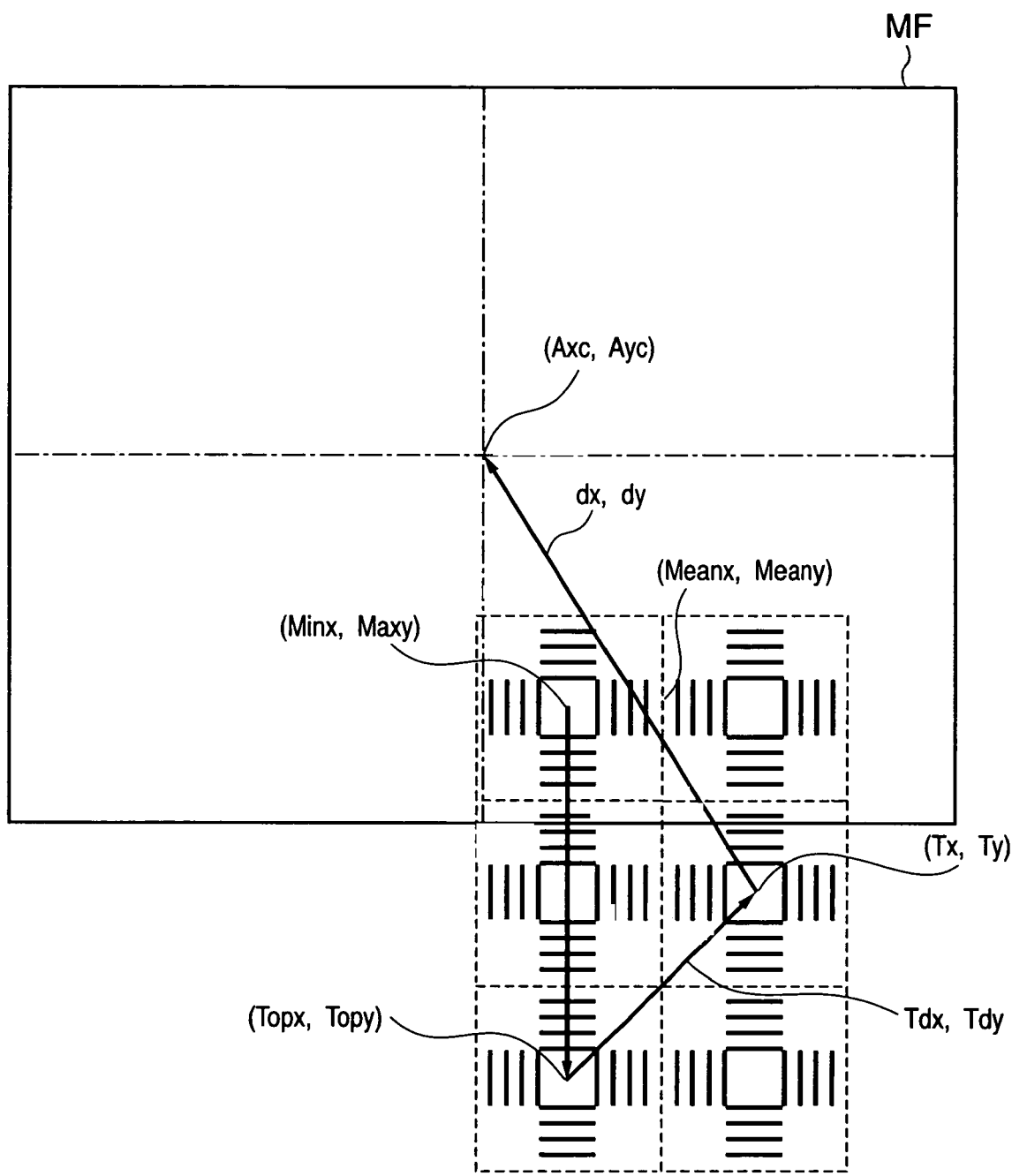

A method of estimating the target mark will be described with reference to FIG. 3E. The method includes a case wherein not all the marks can be detected within the visual field. The following conditions are added. The coordinated system has an origin (0,0) at the lower left corner and represents the first quadrant.

Nx×Ny marks are two-dimensionally arranged at a mark spacing of Mx and My in the visual field having a size of Ax×Ay. The number of arranged marks satisfies the following conditions:

$$Ax > Mx \times (Nx-1)$$

$$Ay > My \times (Ny-1)$$

The mark at the lower left corner is defined as the top mark of a group of two-dimensionally arranged marks.

A plurality of mark coordinates detected in the visual field are represented by $(X_{ij}, Y_{ij})$ {i=1, 2, ... kj=1, 2, ..., l} (K<=Nx, 1<=Ny). A method of determining the moving amount to the target mark coordinates and target mark will be described.

For the sake of descriptive simplicity, a method of identifying the target mark from the number of times of measurement in the Y direction and the positions will be described. If the number of marks which can be detected is one (<Ny), the upper or lower portion of Ny marks projects from the visual field. If 1=Ny holds, part of the Ny marks is not projected.

First, in which direction of the upward and downward directions the group of marks are moved is checked. For this purpose, the mean position of the detected marks is obtained.

$$\text{Mean } y = \frac{1}{k}\sum_{j=1}^{k} y_{ij}$$

Meany is compared with the center of visual field Ayc. If Meany>Ayc holds, it is determined that the mark group moves upward; and if Meany<Ayc holds, it is determined that the mark group moves downward.

The top coordinates of the marks are calculated. The mark on the lower sides in the Y direction and on the left sides in the X direction is assumed to have the top coordinates. If it is determined in the above-mentioned comparison that the mark group moves upward, the mark having the minimum Y-coordinate Miny=Min ($y_{ij}$ {j=1, 2, , , , 1}) among the detected marks has the top coordinate Topy of the marks. If it is determined that the mark group moves downward, the top mark may project from the visual field. The mark at the upper left corner out of the marks has the maximum Y-coordinate Maxy=Max($y_{ij}$ {j=1, 2, , , , 1}) out of the detected marks. For this reason, the top mark has a coordinate Maxy=My×(Ny−1). The same operation is performed for the X direction to determine the position of the top mark, thereby determining the coordinates of the top mark at the lower left corner out of the mark group. In summary, the coordinates of the top mark are determined by the following conditions.

If (Meanx≧Axc)

$$Topx=Min(x_{ij}\{i=1, 2, , , , k\})$$

If (Meanx<Axc)

$$Topx=Max(x_{ij}\{i=1, 2, , , , k\})-Mx \times (Nx-1)$$

If (Meany≧Ayc)

$$\text{Top}y = \text{Min}(y_{lj}\{j=1, 2, \ldots, l\})$$

If (Meany<Ayc)

$$\text{Top}y = \text{Max}(y_{lk}\{j=1, 2, \ldots, k\}) - My \times (Ny-1)$$

Finally, the target mark is estimated from the coordinates of the top mark (Topx, Topy). The relative spacing (Tdx, Tdy) between the target mark and the top mark is known. Thus, the coordinates (Tx, Ty) of the target mark are calculated by the following operations.

$$Tx = \text{Top}x + Tdx$$

$$Ty = \text{Top}y + Tdy$$

A spacing between the center of the visual field and the target mark is obtained to calculate the stage moving amount (dx, dy).

$$dx = Ax/2 - Tx$$

$$dy = Ay/2 - Ty.$$

In extreme cases, only one mark is detected. Even in this case, it is determined in which direction the mark group moves, and the coordinates of a target mark which falls outside the visual field and stage moving amount can be determined. If all the marks are detected as well, the coordinates of the target mark and stage moving amount can be determined by using the above-mentioned expressions.

Calculation in the case of FIG. 3E will be described more specifically. Nx=2 and Ny=3. A group of six marks moves in the lower right direction. Assume that marks L1 and O1 are detected, and the target mark is P1. If the mean value (Meanx, Meany) of the detected marks is compared with the center (Axc, Ayc) of the visual field, Meanx>Axc and Meany<Ayc hold.

Since Meanx>Axc holds, the minimum value out of the detected marks is selected, and Topx is set to be Minx.

Since MeanY<Ayc holds, the maximum value out of the detected marks is selected, and Topy is set to Maxy−My× (3−1).

Since the spacing Tdx, Tdy between the top mark of the mark group and the mark P1 is known in advance, the coordinates of the target mark are calculated by Tx=Topx+ Tdx and Ty=Topy+Tdy. Finally, the spacing to the center of the visual field is calculated by dx=Ax/2−Tx and dy=Ay/2− Ty.

As described above, even if the target mark cannot be specified, it can be estimated using the positions and number of detected marks if the number of all marks and relative spacing between the marks are stored. The stage moving amounts dx and dy for high-magnification detection are calculated. High-magnification detection of the target mark can be performed after stage movement.

Assume that the stage moves to a predetermined target mark, and it is determined that high-magnification is impossible due to a signal degradation. Even in this case, the target mark is changed to any other mark whose coordinates are known in advance, the stage is moved, and high-magnification measurement is performed, as described in the first embodiment.

The above-mentioned embodiments each propose a method of determining an alignment mark as the measurement target when a plurality of alignment marks having similar shapes are present in the visual field of the low-magnification system in simultaneous measurement by the high- and low-magnification systems. According to the present invention, alignment can be performed without any restraints on forming alignment marks and without decreasing the throughput.

Even when it is difficult to identify the target mark due to its degradation, the position of the target mark can be estimated from the positional relationship between the target mark and each of the marks whose positional relationship is stored.

If it is determined in high-magnification measurement of the target mark that measurement is impossible due to a signal degradation, alignment processing can be continued without stopping the apparatus, by changing the target mark to any of other marks whose positions are stored.

Even if the target mark degrades, accurate mark position detection can be performed with the high-magnification system by the following operation. More specifically, the stage feed moving amount to a mark to be detected only by the high-magnification system is calculated on the basis of a result of marks to be detected simultaneously by the low- and high-magnification systems while estimating or changing the target mark, and the rotational component θ, magnification component Mag, and shiftx and shifty are corrected. A decrease in throughput due to θ rotational operation can be prevented by a method not including θ rotational operation of the stage in correcting the rotational component, that is, aligning a mark by stage movement in which the θ component decomposes into X and Y components.

A method of narrowing the search area by the low-magnification system for the second and subsequent wafers, and accurately searching only the target mark if a plurality of similar alignment marks are present, has been proposed. This is effective in reducing the alignment time.

If the target mark after the change due to a signal degradation is continuously used for the second and subsequent wafers, the probability of changing the target mark decreases, resulting in stable measurement and a reduction in alignment time.

[Device Manufacturing Method]

A device manufacturing method using the above-mentioned semiconductor manufacturing apparatus will be described.

Figure 8:
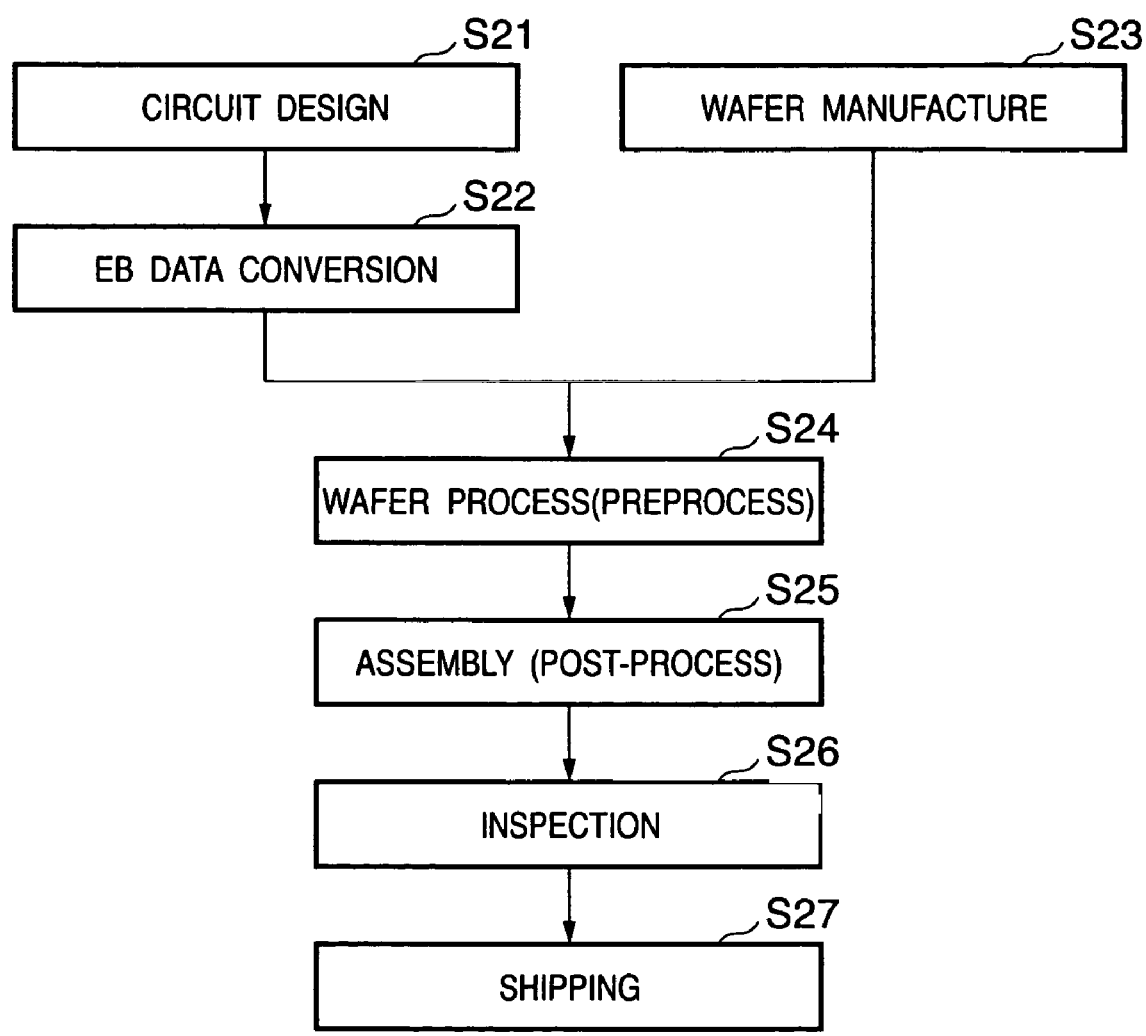
FIG. 8 is a flow chart for explaining the flow of the manufacture of a semiconductor device.

FIG. 8 shows the flow of the manufacture of a microdevice (e.g., a semiconductor chip such as an IC or LSI, a liquid crystal panel, a CCD, a thin-film magnetic head, or a micromachine). In step S21 (circuit design), a semiconductor device circuit is designed. In step S22 (exposure control data creation), exposure control data for an exposure apparatus is created on the basis of the designed circuit pattern. In step S23 (wafer manufacture), a wafer is manufactured by using a material such as silicon. In step S24 (wafer process), called a preprocess, an actual circuit is formed on the wafer by lithography using the wafer and the exposure apparatus, into which the prepared exposure control data is entered mask. Step S25 (assembly), called a post-process, is the step of forming a semiconductor chip by using the wafer formed in step S24, and includes an assembly process (dicing and bonding) and a packaging process (chip encapsulation). In step S26 (inspection), the semiconductor device manufactured in step S25 undergoes inspections such as an operation confirmation test and a durability test. After these steps, the semiconductor device is completed and shipped (step S27).

Figure 9:
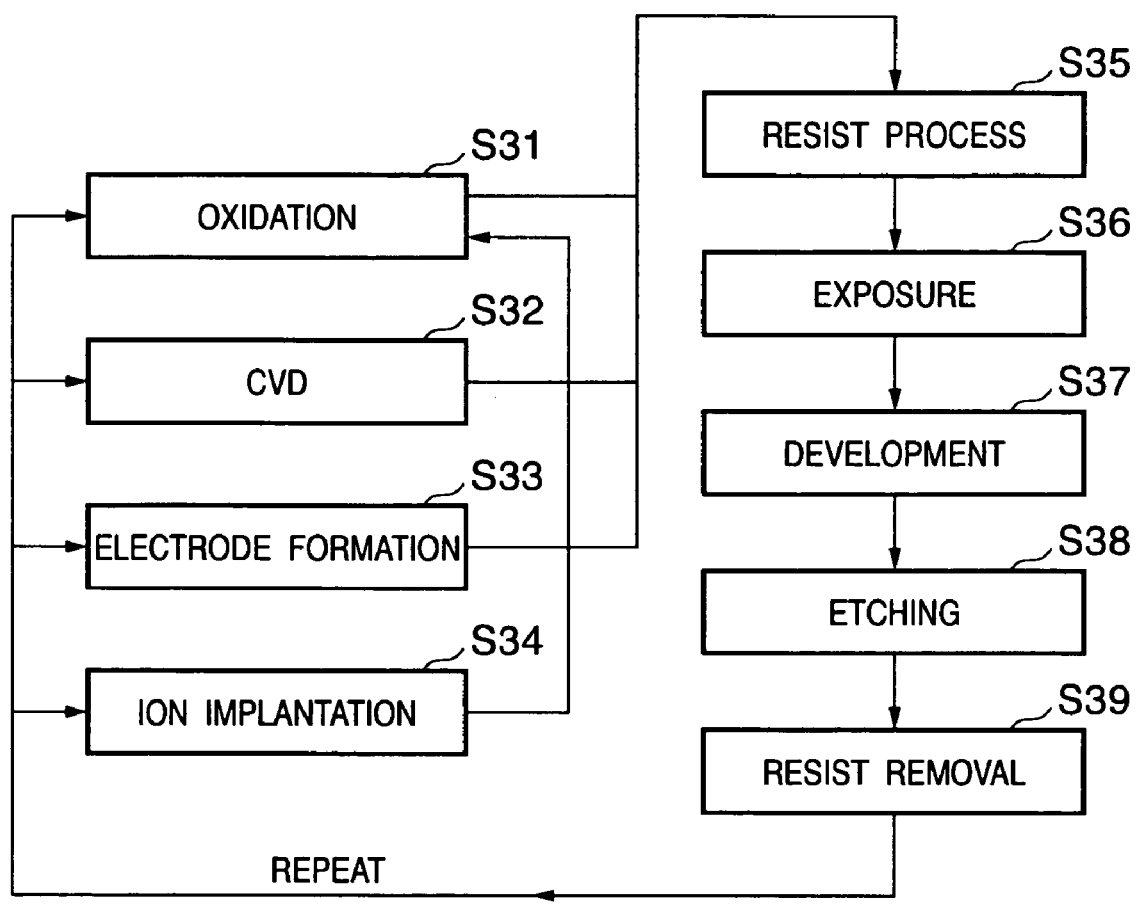
FIG. 9 is a flow chart for explaining the wafer process.

FIG. 9 shows the detailed flow of the above-mentioned wafer process. In step S31 (oxidation), the wafer surface is oxidized. In step S32 (CVD), an insulating film is formed on the wafer surface. In step S33 (electrode formation), an electrode is formed on the wafer by vapor deposition. In step S34 (ion implantation), ions are implanted in the wafer. In step S35 (resist processing), a photosensitive agent is applied to the wafer. In step S36 (exposure), the circuit pattern is printed onto the wafer by exposure using the above-mentioned exposure apparatus. In step S37 (development), the exposed wafer is developed. In step S38 (etching), the resist is etched except for the developed resist image. In step S39 (resist removal), an unnecessary resist after etching is removed. These steps are repeated to form multiple circuit patterns on the wafer.

The device manufacturing method of this embodiment can manufacture, at low cost, a highly integrated semiconductor device, which is hard to manufacture by a conventional method.

Another Embodiment

The functions of the above-mentioned embodiments can also be achieved by supplying software, such as a program for implementing the processing flows of the embodiments to a system or an apparatus directly or from a remote place, and allowing a computer of the system or apparatus to read out and execute the supplied software. In this case, the form need not be a program as long as the software has a program function.

Embodiments of the present invention include software itself installed in the computer in order to realize the functions and processes of the above-mentioned embodiments by the computer.

In this case, the software includes, for example, an object code, a program executed by an interpreter, script data supplied to an operating system (OS), or the like. The type of software is not specifically limited.

A recording medium for supplying the software includes, for example, a flexible disk, a hard disk, an optical disk, a magnetooptical disk, an MO, a CD-ROM, a CD-R, a CD-RW, a magnetic tape, a nonvolatile memory card, a ROM, a DVD (DVD-ROM and DVD-R), and the like.

The software can be supplied by downloading the software itself or a compressed file containing an automatic installing function from an Internet homepage to a recording medium, such as a hard disk, via the browser of the client computer. The software can also be supplied by dividing the software into a plurality of files, and downloading the files from different homepages. Hence, embodiments of the present invention also include a world wide web (WWW) server which allows the user to download the software.

The software can also be supplied by the following operation. A storage medium such as a CD-ROM having the software encrypted and stored therein is distributed to the users. A user who satisfies predetermined conditions is caused to download decryption key information from a homepage via the Internet. The user installs the encrypted software in the computer by using the key information.

The functions of the above-mentioned embodiments are realized when the computer executes the readout software. Also, embodiments of the present invention include a case wherein the functions of the above-mentioned embodiments are realized when an operating system (OS) or the like, running on the computer, performs part or all of actual processing on the basis of the instructions of the software.

Furthermore, embodiments of the present invention include a case wherein the functions of the above-mentioned embodiments are also realized when the program read out from the recording medium is written in the memory of a function expansion board inserted into the computer or a function expansion unit connected to the computer, and the CPU, or the like, and the function expansion board or function expansion unit performs part or all of actual processing on the basis of the instructions of the software.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for exposing a substrate to a pattern, said apparatus detecting a position of a target mark out of a plurality of marks, disposed with respect to each shot of the substrate to obtain a position of a shot, said apparatus comprising:
   a stage configured to mount the substrate and to be moved;
   a scope configured to sense an image of the substrate at a first magnification and an image of the substrate at a second magnification higher than the first magnification;
   a processor configured to extract, from an image sensed by said scope at the first magnification, a position of a first mark out of the plurality of marks and a feature of a region outside the first mark, to identify the first mark based on the extracted feature, to extract, from an image sensed by said scope at the second magnification, a position of the target mark, to evaluate reliability of the extracted position of the target mark, to select a second mark, instead of the target mark, from the plurality of marks as a new target mark based on the identified first mark, if the evaluated reliability is less than a threshold, and to extract a position of the selected second mark from an image sensed by said scope at the second magnification; and
   a controller configured to control a position of said stage based on the extracted position of the second mark.

2. An apparatus according to claim 1, wherein the feature corresponds to an auxiliary pattern, which is included in the object and is associated with the first mark.

3. An apparatus according to claim 2, wherein the plurality of marks have different auxiliary patterns, respectively.

4. An apparatus according to claim 2, wherein the auxiliary pattern is connected to the first mark.

5. An apparatus according to claim 2, wherein the auxiliary pattern is surrounded by the first mark.

6. An apparatus according to claim 1, wherein the feature corresponds to a position of the first mark relative to another mark out of the plurality of marks.

7. An apparatus according to claim 1, wherein the feature corresponds to a position of the first mark relative to plural marks out of the plurality of marks.

8. An apparatus according to claim 1, wherein said processor is configured to select the second mark as the new target mark from a plurality of marks, out of the plurality of marks, extracted by said processor from the image that is sensed by said scope at the first magnification.

9. An apparatus according to claim 8, wherein said processor is configured to select the second mark as the new target mark based on a contrast of each of the extracted plurality of marks.

10. An apparatus according to claim 1, wherein the object is a substrate on which a device is to be formed.

11. An apparatus according to claim 10, further comprising a stage configured to mount the substrate and to be moved.

12. An apparatus according to claim 11, further comprising a controller configured to control a position of said stage based on the extracted position of the second mark.

13. An apparatus according to claim 1, wherein the object is a first substrate on which a device is to be formed, and a mark corresponding to the second mark is initially selected as the target mark with respect to a subsequent substrate in a lot including the first substrate.

14. A method of detecting a position of a target mark out of a plurality of marks in a region of an object to obtain a position of the region of the object, said method comprising steps of:

sensing a first image of the object at a first magnification;

sensing a second image of the object at a second magnification higher than the first magnification;

extracting, from the first image, a position of a first mark out of the plurality of marks and a feature of a region outside the first mark;

identifying the first mark based on the extracted feature;

extracting, from the second image, a position of the target mark;

evaluating reliability of the extracted position of the target mark;

selecting a second mark, different from the target mark, from the plurality of marks as a new target mark based on the evaluated reliability and the identified first mark; and extracting a position of the selected second mark from an image sensed at the second magnification.

* * * * *

UNITED STATES PATENT AND TRADEMARK OFFICE
CERTIFICATE OF CORRECTION

PATENT NO. : 7,336,352 B2
APPLICATION NO. : 10/807306
DATED : February 26, 2008
INVENTOR(S) : Hiroshi Tanaka It is certified that error appears in the above-identified patent and that said Letters Patent is hereby corrected as shown below:

COLUMN 2:
  Line 25, "at high" should read -- at a high --.

COLUMN 3:
  Line 29, "increase" should read -- increases --.
  Line 47, "describe" should read -- described --.

COLUMN 4:
  Line 6, "unity" should read -- unit --.
  Line 11, "preformed" should read -- performed --.

COLUMN 8:
  Line 20, "high-magnification." should read -- high-magnification system. --.
  Line 35, "Fx and FY" should read -- FX and FY --.

COLUMN 9:
  Line 22, "preformed" should read -- performed --.

COLUMN 10:
  Line 58, "visual filed." should read -- visual field. --.

COLUMN 11:
  Line 66, "with in" should read -- within --.

COLUMN 12:
  Lines 35-40, "Mean $y = \frac{1}{k}\sum_{j=1}^{k} y_{ij}$ " should read -- $Meany = \frac{1}{k}\sum_{j=1}^{k} y_{ij}$ --.

Line 54, "out of the marks" should read -- out of the group of marks --.

COLUMN 13:
  Lines 3-5, "If (Meany<Ayc)
         Top$y$=Max($y_{lk}${$j$=1, 2, . . ., $k$})-$My$×($Ny$-1)" should read as follows:

-- If (Meany<Ayc)
         Top$y$=Max($y_{ij}${$j$=1, 2, . . ., $k$})-$My$×($Ny$-1) --.

UNITED STATES PATENT AND TRADEMARK OFFICE
CERTIFICATE OF CORRECTION

PATENT NO. : 7,336,352 B2
APPLICATION NO. : 10/807306
DATED : February 26, 2008
INVENTOR(S) : Hiroshi Tanaka It is certified that error appears in the above-identified patent and that said Letters Patent is hereby corrected as shown below:

COLUMN 14:
    Line 50, "entered" should read -- entered. --.
    Line 51, "mask." should be deleted.

Signed and Sealed this

Twentieth Day of January, 2009

JON W. DUDAS
*Director of the United States Patent and Trademark Office*